United States Patent
Jang et al.

(10) Patent No.: US 9,161,479 B2
(45) Date of Patent: Oct. 13, 2015

(54) POWER MODULE PACKAGE AND METHOD FOR MANUFACTURING THE SAME

(71) Applicant: SAMSUNG ELECTRO-MECHANICS CO., LTD., Suwon-Si (KR)

(72) Inventors: Bum Sik Jang, Suwon-Si (KR); Sung Min Song, Suwon-Si (KR)

(73) Assignee: Samsung Electro-Mechanics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/317,469

(22) Filed: Jun. 27, 2014

(65) Prior Publication Data

US 2015/0173246 A1 Jun. 18, 2015

(30) Foreign Application Priority Data

Dec. 18, 2013 (KR) .................. 10-2013-0158236

(51) Int. Cl.

| | |
|---|---|
| *H01L 25/00* | (2006.01) |
| *H05K 7/20* | (2006.01) |
| *H05K 7/02* | (2006.01) |
| *B29C 65/70* | (2006.01) |
| *H01L 23/48* | (2006.01) |
| *B29K 101/10* | (2006.01) |
| *B29L 31/18* | (2006.01) |
| *H01L 23/40* | (2006.01) |

(52) U.S. Cl.
CPC ............ *H05K 7/20436* (2013.01); *B29C 65/70* (2013.01); *H01L 23/48* (2013.01); *H05K 7/02* (2013.01); *B29K 2101/10* (2013.01); *B29L 2031/18* (2013.01); *H01L 23/4012* (2013.01); *H01L 2023/4043* (2013.01)

(58) Field of Classification Search
CPC ..... H01L 23/36; H01L 23/48; H01L 23/4012; H01L 2023/4043; H01L 2023/405; H01L 2023/4056; H01L 2023/4062; H05K 7/20463; H05K 7/02; B29L 2023/18; B29K 2101/10
See application file for complete search history.

(56) References Cited

U.S. PATENT DOCUMENTS

| | | | |
|---|---|---|---|
| 7,768,107 B2 * | 8/2010 | Bauer et al. | 257/678 |
| 2005/0116335 A1 * | 6/2005 | Karim | 257/718 |
| 2007/0205503 A1 | 9/2007 | Baek | |
| 2010/0055811 A1 * | 3/2010 | Lin et al. | 438/26 |

* cited by examiner

*Primary Examiner* — Victor A Mandala
*Assistant Examiner* — Quovaunda V Jefferson
(74) *Attorney, Agent, or Firm* — Ladas & Parry, LLP (57) ABSTRACT

Disclosed herein are a power module package and a method for manufacturing the same. According to a preferred embodiment of the present invention, a power module package includes: a metal substrate having an insulating layer and a circuit pattern formed on one surface thereof; at least one first electronic device mounted on the circuit pattern; a lead frame disposed around the metal substrate; a molding area enclosing the metal substrate, the first electronic device, and a portion of the lead frame; and a heat sink including a connection part contacting the insulating layer and a body part disposed on a surface opposite to the first electronic device and including one surface bonded to the connection part and the other surface exposed from an upper surface of the molding area.

19 Claims, 8 Drawing Sheets

POWER MODULE PACKAGE AND METHOD FOR MANUFACTURING THE SAME

CROSS REFERENCE TO RELATED APPLICATION

This application claims the benefit of Korean Patent Application No. 10-2013-0158236, filed on Dec. 18, 2013, entitled "Power Module Package and Manufacturing Method for the Same" which is hereby incorporated by reference in its entirety into this application.

BACKGROUND OF THE INVENTION

1. Technical Field

The present invention relates to a power module package and a method for manufacturing the same.

2. Description of the Related Art

Generally, an inverter board for home appliances, such as a refrigerator, a washing machine, and an air conditioner, plays a key role in power control or motor driving.

In particular, a power module package used within the inverter board is a core semiconductor module and is an electronic component having wide marketability even in home, industrial, and car fields.

The power module package is configured to include a power circuit component, a control circuit component, a lead frame, a heat radiation board, and a sealing resin.

In the development of the power module package, a heat radiation characteristic of the board is important in view of reliability of a module, including a lifespan of a power device (IGBT, diode).

Therefore, to improve the heat radiation characteristic of the board, a metal material is used as a base of the board and a copper foil (Cu foil) for forming a metal base and a circuit has a structure in which the copper foil is bonded to an insulating layer or a metal oxidizing layer.

PRIOR ART DOCUMENT

Patent Document (Patent Document 1) US Patent Application Publication No. US 2007/0205503A1

SUMMARY OF THE INVENTION

The present invention has been made in an effort to provide a structure of a power module package capable of constantly maintaining an interval between a heat sink and an electrolytic cap which are bonded to the power module package without a stopper required to constantly maintain the interval between the heat sink and the electrolytic cap, when the power module package and the electrolytic cap are mounted on a board.

Further, the present invention has been made in an effort to provide a structure of a power module package capable of more effectively radiating heat of electronic devices.

According to a preferred embodiment of the present invention, there is provided a power module package including: a metal substrate having an insulating layer and a circuit pattern formed on one surface thereof; at least one first electronic device mounted on the circuit pattern; a lead frame disposed around the metal substrate; a molding area enclosing the metal substrate, the first electronic device, and a portion of the lead frame; and a heat sink including a connection part contacting the insulating layer and a body part disposed on a surface opposite to the first electronic device and including one surface bonded to the connection part and the other surface exposed from an upper surface of the molding area.

The first electronic device may be a power device.

The power module package may further include: a second electronic device mounted on the lead frame.

The second electronic device may be a control device.

The heat sink may be made of a conductive metal material.

The body part of the heat sink may cover the whole of the upper surface of the molding area.

The body part of the heat sink may cover a portion of the upper surface of the molding area.

A height of the other surface of the body part of the heat sink may be formed to be higher than or equal to the upper surface of the molding part.

A height of the other surface of the body part of the heat sink may be formed to be lower than or equal to the upper surface of the molding part.

According to another preferred embodiment of the present invention, there is provided a method for manufacturing a power module package including: preparing a lead frame disposed around a metal substrate having one surface formed with a circuit pattern on which a first electronic device is mounted and an insulating layer; forming a molding area enclosing the metal substrate, the first electronic device, and a portion of the lead frame; and preparing a heat sink including a connection part contacting the insulating layer and a body part bonded to the connection part and having one surface disposed on a surface opposite to the first electronic device and the other surface exposed from an upper surface of the molding area and fastening the heat sink to contact the insulating layer.

The first electronic device may be a power device.

The method for manufacturing a power module package may further include: prior to the forming of the molding part, electrically connecting the first electronic device with the lead frame.

The heat sink may be made of a conductive metal material.

The body part of the heat sink may have a size covering the whole of the upper surface of the molding area.

The body part of the heat sink may have a size covering a portion of the upper surface of the molding area.

The other surface of the body part of the heat sink may be formed to be equal to or higher than the upper surface of the molding part.

The other surface of the body part of the heat sink may be formed to be equal to or lower than the upper surface of the molding part.

The method for manufacturing a power module package may further include: prior to the forming of the molding part, standing and fixing a support pin on the insulating layer at a position corresponding to a position into which the connection part of the heat sink is inserted; and after the forming of the molding part, forming a through hole exposing an insulating layer from the upper surface of the molding part by removing the support pin.

The method for manufacturing a power module package may further include: after the forming of the molding part, hardening a molding area by a thermosetting process.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first," "second," "one side," "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, a touch sensor according to preferred embodiments of the present invention will be described with reference to accompanying drawings, in which like components are denoted by like reference numerals.

Power Module Package

First Preferred Embodiment

Figure 1:
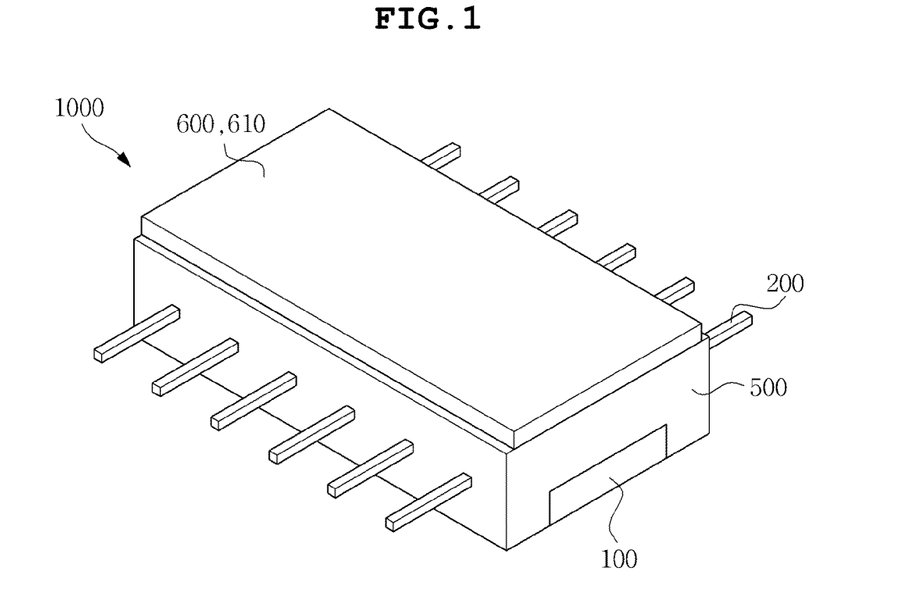
FIG. 1 is a perspective view schematically illustrating a structure of a power module package according to a first preferred embodiment of the present invention.
Figure 2:
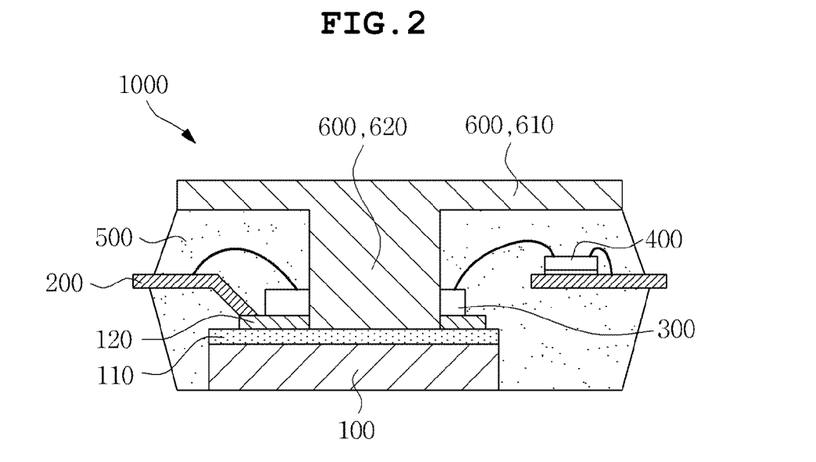
FIG. 2 is a right cross-sectional view schematically illustrating the structure of the power module package according to the first preferred embodiment of the present invention.
Figure 3:
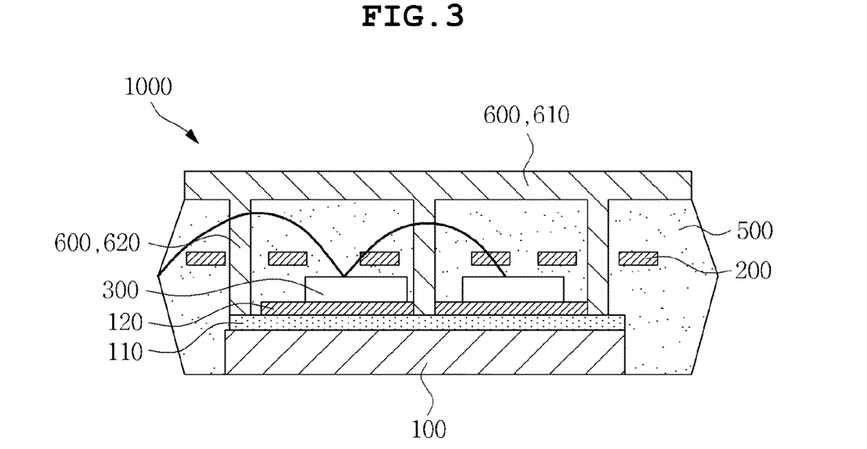
FIG. 3 is a left cross-sectional view schematically illustrating the power module package according to the first preferred embodiment of the present invention.

FIGS. 1 and 3 are diagrams schematically illustrating a structure of a power module package 1000 according to a first preferred embodiment of the present invention.

Referring to FIGS. 1 to 3, the power module package 1000 includes a metal substrate 100 which has an insulating layer 110 and a circuit pattern 120 formed on one surface thereof, at least one first electronic device 300 which is mounted on the circuit pattern 120, a lead frame 200 which is disposed around the metal substrate 100, a molding area 500 enclosing the metal substrate 100, the first electronic device 300, and a portion of the lead frame 200, and a heat sink 600 which includes a connection part 620 contacting the insulating layer 110 and a body part 610 disposed on a surface opposite to the first electronic device 300 and including one surface bonded to the connection part 620 and the other surface exposed from an upper surface of the molding area 500.

In this case, the metal substrate 100 may be made of any one selected from aluminum (Al), aluminum alloy (Al alloy), copper (Cu), iron (Fe), iron-nickel alloy (Fe—Ni alloy), and titanium (Ti) which are conductive metal materials, but is not particularly limited thereto.

According to the preferred embodiment of the present invention, a circuit pattern 120 may be formed on the metal substrate 100 including the insulating layer 110 or the circuit pattern 120 may be formed on the metal substrate 100 including an anodized layer.

The anodized layer is generated by immersing the metal substrate 100 made of aluminum or aluminum alloy in an electrolyte solution such as boric acid, phosphoric acid, sulfuric acid, chromic acid, or the like, applying an anode to the metal substrate, and applying a cathode to the electrolyte solution and has an insulating property and relatively high heat transfer characteristics of about 10 to 30 W/mk.

As described above, the anodized layer made of aluminum or aluminum alloy may be an aluminum anodized layer ($Al_2O_3$).

The anodized layer has insulation property, and therefore a circuit layer may be formed on the substrate. In addition, the anodized layer may have a thickness thinner than that of a general insulation layer 110, and therefore may improve the heat radiation performance as well as may be formed in a thin type.

The circuit pattern 120 is formed on the insulating layer 110 or the anodized layer and a circuit may be formed by a pattern forming method already known in the art. In this case, any material which is used as a conductive metal may be used without limitation but copper is typically used.

The preferred embodiment of the present invention describes the metal substrate 100 configured of the insulating layer 110, the anodized layer, and the circuit pattern 120, by way of example, but is not particularly limited thereto. For example, a printed circuit board (PCB), a substrate made of ceramic, and the like may be used.

The first electronic devices 300 are mounted on the circuit pattern 120 which is formed on the metal substrate 100, in which at least one first electronic device 300 is bonded thereto and may be a power device.

For example, the power device may include a silicon controlled rectifier (SCR), a power transistor, an insulated gate bipolar transistor (IGBT), a metal oxide semiconductor (MOS) transistor, a power rectifier, a power regulator, an inverter, a converter, or a device having a large heat value, such as a high power semiconductor chip or diode including a combination thereof.

In these drawings, other components of the electronic device are omitted and schematically illustrated, but it may be sufficiently recognized by those skilled in the art that the electronic device having all the structures known in the art may be applied to the power module package 1000 according to the preferred embodiment of the present invention without being particularly limited.

In this case, the first electronic device 300 may be formed on the circuit pattern 120 by soldering or conductive epoxy or ultrasonic bonding process, but is not particularly limited thereto.

The soldering may be made by using, for example, a Sn—Pb eutectic solder or a lead free solder such as Sn—Ag—Cu. Further, the soldering method may be formed of a solder paste applying process using a metal mask. However, the soldering method is not limited thereto.

As a connection terminal for electrically connecting between an inside and an outside of the power module package 1000, at least one lead frame 200 may be disposed around the metal substrate 100.

The lead frame 200 may be made of any one selected from copper (Cu), iron (Fe), and iron-nickel alloy (Fe—Ni alloy), but is not particularly limited thereto.

When the lead frame 200 is disposed around the metal substrate 100, the lead frame 200 may be connected to the metal substrate 100, the first electronic device 300, and a second electronic device 400 to be described below by a conductive connection part 620.

Further, a shape of the lead frame 200 may be variously changed, and thus is changed as the designer desired shape and may directly contact the circuit pattern 120 and thus is electrically connected thereto.

In the present drawings, the lead frame 200 is not formed with a step part, but may be additionally formed with at least one step part.

In this case, the connection part 620 may be a wire, and at least two of the metal substrate 100, the lead frame 200, the first electronic device 300, and the second electronic device 400 are selected and may be electrically connected to each other by various methods in addition to a wire bonding.

Here, the wire bonding process may be performed by ball bonding, wedge bonding, and stitch bonding well known in the art, but is not particularly limited thereto.

Here, the wire is made of aluminum (Al), gold (Au), copper (Cu), and the like, but the preferred embodiment of the present invention is not particularly thereto. Generally, the wire applying a high rated voltage to the electronic device which is the power device is made of aluminum (Al). Meanwhile, a thick wire needs to be used to withstand a high voltage. Therefore, it is more effective to use aluminum (Al) in terms of the reduction in costs than using gold (Au) or copper (Cu).

The connection part 620 is not particularly limited, but instead of the wire, the lead frame, a metal ribbon, or the like may also be used At least one second electronic device 400 may be mounted on the lead frame 200.

The second electronic device 400 may be a control device and is a device having a small heat value like a control integrated circuit (IC).

As described above, the power module package 1000 further includes the molding area enclosing the metal substrate 100, the first electronic device 300, the second electronic device 400, and the lead frame 200. In this case, one surface of the metal substrate 100 and a portion of the lead frame 200 may be exposed to the outside.

In this case, since the molding area 500 is formed to be filled in the upper portion of the metal substrate 100, an adhesion between a molding material and the metal substrate 100 is increased, such that an occurrence of a problem such as delamination between the metal substrate 100 and the molding area 500 is reduced, thereby improving the long-term reliability of the substrate.

Further, heat shielding due to the molding is made, and therefore the heat radiation effect may be more improved by enclosing the electronic device having a large heat value like the power device.

The molding area 500 is filled between the first electronic device 300 mounted on the metal substrate 100 and the second electronic device 400 mounted on the lead frame 200 to prevent an electrical short from occurring between the electronic devices. Further, the molding area encloses and fixes outside the electronic device to safely protect the electronic device from an external impact.

In this case, the molding area 500 may be made of a thermoplastic resin, such as silicon gel and polyimide, a thermosetting resin, such as epoxy resin, and the like, and the molding area 500 may generally be made of an epoxy molded compound (EMC), but is not particularly limited thereto.

In this case, a portion of the molding area 500 is formed with cavities into which the connection parts 620 of the heat sink 600 to be described below are inserted and a position of the cavity is the same as a position into which the connection part 620 of the heat sink 600 is inserted.

The heat sink 600 includes a plate-shaped body part 610 which is located at a surface opposite to the first electronic device 300 and a plurality of connection parts 620 formed on one surface of the body part 610.

Here, the plurality of connection parts 620 are inserted into the cavities of the molding area 500 as described above and is bonded to the insulating layer 110 of the metal substrate 100.

When the connection part 620 of the heat sink 600 is bonded to the circuit pattern 120 which is formed on the metal substrate 100 or the insulating layer 110, sparking occurs and thus the insulating material therearound is broken and other various defects may occur but the connection part 620 of the heat sink 600 is bonded to the insulating layer 110, thereby stably bonded the metal substrate 100 with the heat sink 600.

The body part 610 has a plate shape and includes one surface connected to the plurality of connection parts 620 and the other surface exposed from the upper surface of the molding area 500 as described above.

The body part 610 of the heat sink 600 has a size covering the whole of the upper surface of the molding area 500 and a height of the other surface of the body part 610 may be formed to be higher than or equal to the upper surface of the molding area 500.

As such, the heat radiation performance may be controlled as the designer needs by controlling the size and height of the heat sink 600 and the heat sink 600 is easily detached by a physical force.

The heat sink 600 is made of a material of copper Cu or tin (Sn) having excellent heat conductivity without being particularly limited and may be generally configured by being coated with the material.

Although not illustrated in the drawings of the preferred embodiment of the present invention, the power module package 1000 may further include another heat sink (not illustrated) which is bonded to the other surface of the metal substrate 100 exposed by the molding area 500.

The heat sink (not illustrated) may include a plurality of heat radiating pin to diffuse heat generated from the first electronic device 300 to the air.

Further, the heat sink (not illustrated) is not particularly limited, but is generally made of the material of copper (Cu) or tin (Sn) like the heat sink (not illustrated) as described above and is generally configured by being coated with the material, such that the heat sink has the excellent heat transfer characteristics and is easily bonded to the substrate.

The power module package 1000 according to the preferred embodiment of the present invention has a structure in which the heat sinks 600 are formed on both surfaces of the metal substrate 100, thereby obtaining the excellent heat radiation effect.

Figure 4:
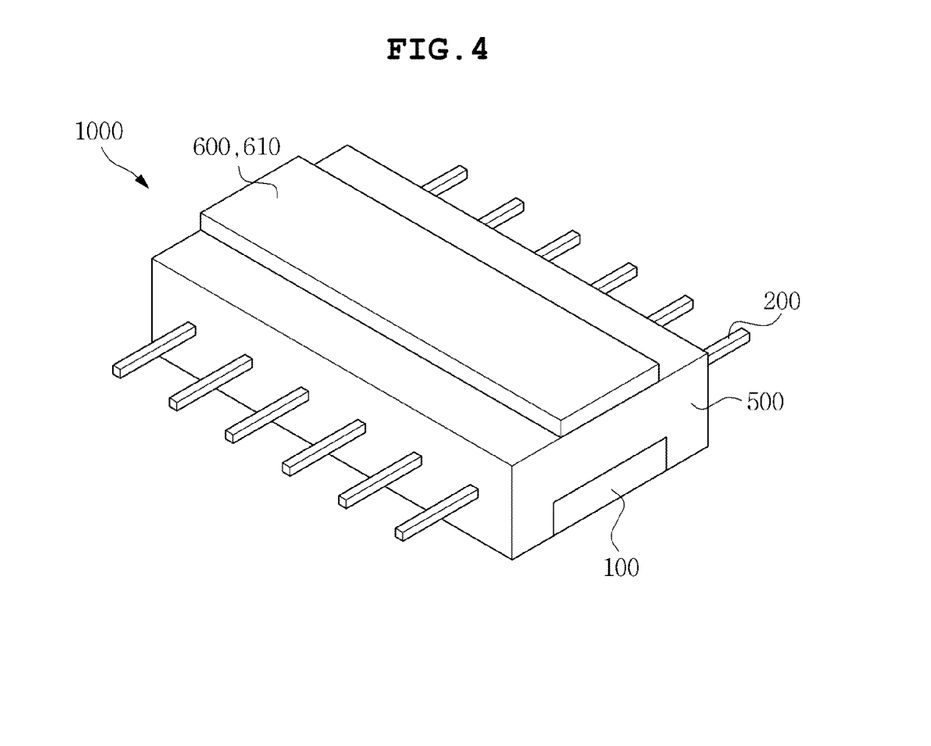
FIG. 4 is a perspective view schematically illustrating a power module package according to a second preferred embodiment of the present invention.
Figure 5:
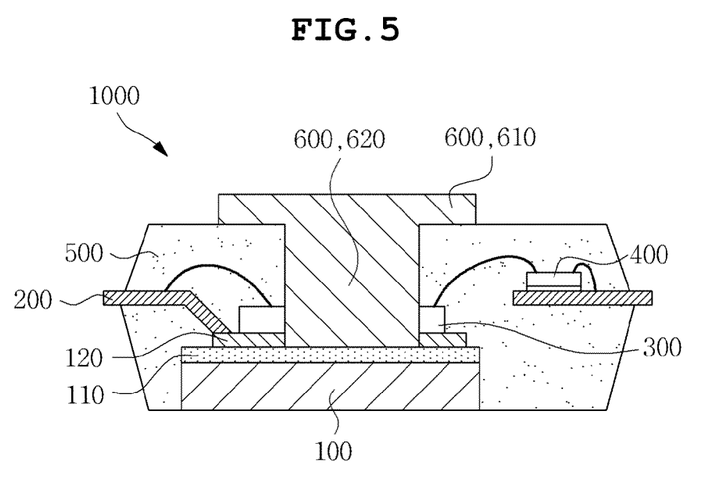
FIG. 5 is a right cross-sectional view schematically illustrating the power module package according to the second preferred embodiment of the present invention.
Figure 6:
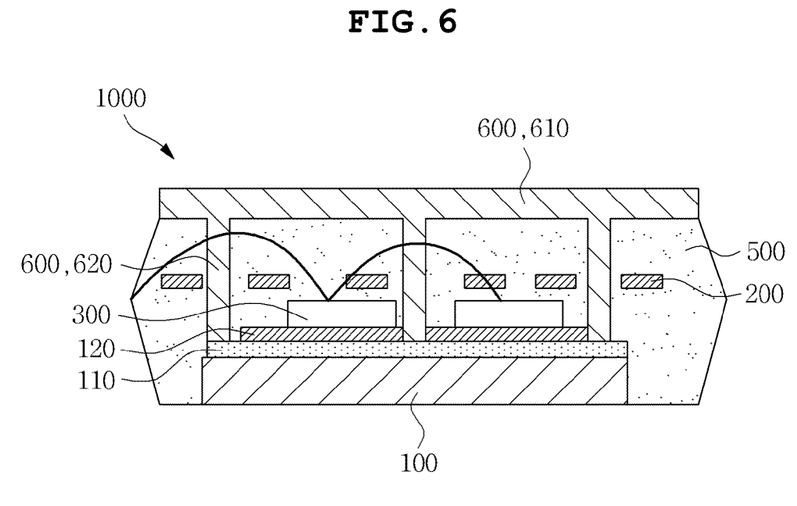
FIG. 6 is a left cross-sectional view schematically illustrating the power module package according to the second preferred embodiment of the present invention.

Further, it is possible to constantly maintain the interval between another heat sink (not illustrated) and the electrolytic cap (not illustrated) which are bonded to the package board without the stopper, by controlling the height of the heat sink Second Preferred Embodiment FIGS. 4 and 6 are diagrams schematically illustrating a structure of a power module package 1000 according to a second preferred embodiment of the present invention.

Referring to FIGS. 4 to 6, the power module package 1000 includes a metal substrate 100 which has an insulating layer 110 and a circuit pattern 120 formed on one surface thereof, at least one first electronic device 300 which is mounted on the circuit pattern 120, a lead frame 200 which is disposed around the metal substrate 100, a molding area 500 enclosing the metal substrate 100, the first electronic device 300, and a portion of the lead frame 200, and a heat sink 600 which includes a connection part 620 contacting the insulating layer 110 and a body part 610 disposed on a surface opposite to the first electronic device 300 and including one surface bonded to the connection part 620 and the other surface exposed from an upper surface of the molding area 500.

In this case, the metal substrate 100 may be made of any one selected from aluminum (Al), aluminum alloy (Al alloy), copper (Cu), iron (Fe), iron-nickel alloy (Fe—Ni alloy), and titanium (Ti) which are conductive metal materials, but is not particularly limited thereto.

According to the preferred embodiment of the present invention, a circuit pattern 120 may be formed on the metal substrate 100 including the insulating layer 110 or the circuit pattern 120 may be formed on the metal substrate 100 including an anodized layer.

The anodized layer is generated by immersing the metal substrate 100 made of aluminum or aluminum alloy in an electrolyte solution such as boric acid, phosphoric acid, sulfuric acid, chromic acid, or the like, applying an anode to the metal substrate, and applying a cathode to the electrolyte solution and has an insulating property and relatively high heat transfer characteristics of about 10 to 30 W/mk.

As described above, the anodized layer made of aluminum or aluminum alloy may be an aluminum anodized layer ($Al_2O_3$).

The anodized layer has insulation property, and therefore a circuit layer may be formed on the substrate. In addition, the anodized layer may have a thickness thinner than that of a general insulation layer 110, and therefore may improve the heat radiation performance as well as may be formed in a thin type.

The circuit pattern 120 is formed on the insulating layer 110 or the anodized layer and a circuit may be formed by a pattern forming method already known in the art. In this case, any material which is used as a conductive metal may be used without limitation but copper is typically used.

The preferred embodiment of the present invention describes the metal substrate 100 configured of the insulating layer 110, the anodized layer, and the circuit pattern 120, by way of example, but is not particularly limited thereto. For example, a printed circuit board (PCB), a substrate made of ceramic, and the like may be used.

The first electronic devices 300 are mounted on the circuit pattern 120 which is formed on the metal substrate 100, in which at least one first electronic device 300 is bonded thereto and may be a power device.

For example, the power device may include a silicon controlled rectifier (SCR), a power transistor, an insulated gate bipolar transistor (IGBT), a metal oxide semiconductor (MOS) transistor, a power rectifier, a power regulator, an inverter, a converter, or a device having a large heat value, such as a high power semiconductor chip or diode including a combination thereof.

In these drawings, other components of the electronic device are omitted and schematically illustrated, but it may be sufficiently recognized by those skilled in the art that the electronic device having all the structures known in the art may be applied to the power module package 1000 according to the preferred embodiment of the present invention without being particularly limited.

In this case, the first electronic device 300 may be formed on the circuit pattern 120 by soldering or conductive epoxy or ultrasonic bonding process, but is not particularly limited thereto.

The soldering may be made by using, for example, a Sn—Pb eutectic solder or a lead free solder such as Sn—Ag—Cu. Further, the soldering method may be formed of a solder paste applying process using a metal mask. However, the soldering method is not limited thereto.

As a connection terminal for electrically connecting between an inside and an outside of the power module package 1000, at least one lead frame 200 may be disposed around the metal substrate 100.

The lead frame 200 may be made of any one selected from copper (Cu), iron (Fe), and iron-nickel alloy (Fe—Ni alloy), but is not particularly limited thereto.

When the lead frame 200 is disposed around the metal substrate 100, the lead frame 200 may be connected to the metal substrate 100, the first electronic device 300, and a second electronic device 400 to be described below by a conductive connection part 620.

Further, a shape of the lead frame 200 may be variously changed, and thus is changed as the designer desired shape and may directly contact the circuit pattern 120 and thus is electrically connected thereto.

In the present drawings, the lead frame 200 is not formed with a step part, but may be additionally formed with at least one step part.

In this case, the connection part 620 may be a wire, and at least two of the metal substrate 100, the lead frame 200, the first electronic device 300, and the second electronic device 400 are selected and may be electrically connected to each other by various methods in addition to a wire bonding.

Here, the wire bonding process may be performed by ball bonding, wedge bonding, and stitch bonding well known in the art, but is not particularly limited thereto.

Here, the wire is made of aluminum (Al), gold (Au), copper (Cu), and the like, but the preferred embodiment of the present invention is not particularly thereto. Generally, the wire applying a high rated voltage to the electronic device which is the power device is made of aluminum (Al). Meanwhile, a thick wire needs to be used to withstand a high voltage. Therefore, it is more effective to use aluminum (Al) in terms of the reduction in costs than using gold (Au) or copper (Cu).

The connection part 620 is not particularly limited, but instead of the wire, the lead frame, a metal ribbon, or the like may also be used.

At least one second electronic device 400 may be mounted on the lead frame 200.

The second electronic device 400 may be a control device and is a device having a small heat value like a control integrated circuit (IC).

As described above, the power module package 1000 further includes the molding area enclosing the metal substrate 100, the first electronic device 300, the second electronic device 400, and the lead frame 200. In this case, one surface of the metal substrate 100 and a portion of the lead frame 200 may be exposed to the outside.

In this case, since the molding area 500 is formed to be filled in the upper portion of the metal substrate 100, an adhesion between a molding material and the metal substrate 100 is increased, such that an occurrence of a problem such as delamination between the metal substrate 100 and the molding area 500 is reduced, thereby improving the long-term reliability of the substrate.

Further, heat shielding due to the molding is made, and therefore the heat radiation effect may be more improved by enclosing the electronic device having a large heat value like the power device.

The molding area 500 is filled between the first electronic device 300 mounted on the metal substrate 100 and the second electronic device 400 mounted on the lead frame 200 to prevent an electrical short from occurring between the electronic devices. Further, the molding area encloses and fixes outside the electronic device to safely protect the electronic device from an external impact.

In this case, the molding area 500 may be made of a thermoplastic resin, such as silicon gel and polyimide, a thermosetting resin, such as epoxy resin, and the like, and the molding area 500 may generally be made of an epoxy molded compound (EMC), but is not particularly limited thereto.

In this case, a portion of the molding area 500 is formed with cavities into which the connection parts 620 of the heat sink 600 to be described below are inserted and a position of the cavity is the same as a position into which the connection part 620 of the heat sink 600 is inserted.

The heat sink 600 includes a plate-shaped body part 610 which is located at a surface opposite to the first electronic device 300 and a plurality of connection parts 620 formed on one surface of the body part 610.

Here, the plurality of connection parts 620 are inserted into the cavities of the molding area 500 as described above and is bonded to the insulating layer 110 of the metal substrate 100.

When the connection part 620 of the heat sink 600 is bonded to the circuit pattern 120 which is formed on the metal substrate 100 or the insulating layer 110, sparking occurs and thus the insulating material therearound is broken and other various defects may occur but the connection part 620 of the heat sink 600 is bonded to the insulating layer 110, thereby stably bonded the metal substrate 100 with the heat sink 600.

The body part 610 has a plate shape and includes one surface connected to the plurality of connection parts 620 and the other surface exposed from the upper surface of the molding area 500 as described above.

The body part 610 of the heat sink 600 has a size covering a portion of the upper surface of the molding area 500 and a height of the other surface of the body part 610 may be formed to be lower than or equal to the upper surface of the molding area 500.

As such, the heat radiation performance may be controlled as the designer needs by controlling the size and height of the heat sink 600 and the heat sink 600 is easily detached by a physical force.

The heat sink 600 is made of a material, such as copper Cu or tin (Sn) having excellent heat conductivity without being particularly limited and may be generally configured by being coated with the materials.

Although not illustrated in the drawings of the preferred embodiment of the present invention, the power module package 1000 may further include another heat sink (not illustrated) which is bonded to the other surface of the metal substrate 100 exposed by the molding area 500.

The heat sink (not illustrated) may include a plurality of heat radiating pin to diffuse heat generated from the first electronic device 300 to the air.

Further, the heat sink (not illustrated) is not particularly limited, but is generally made of the material of copper (Cu) or tin (Sn) like the heat sink (not illustrated) as described above and is generally configured by being coated with the material, such that the heat sink has the excellent heat transfer characteristics and is easily bonded to the substrate.

The power module package 1000 according to the preferred embodiment of the present invention has a structure in which the heat sinks 600 are formed on both surfaces of the metal substrate 100, thereby obtaining the excellent heat radiation effect.

Figure 7:
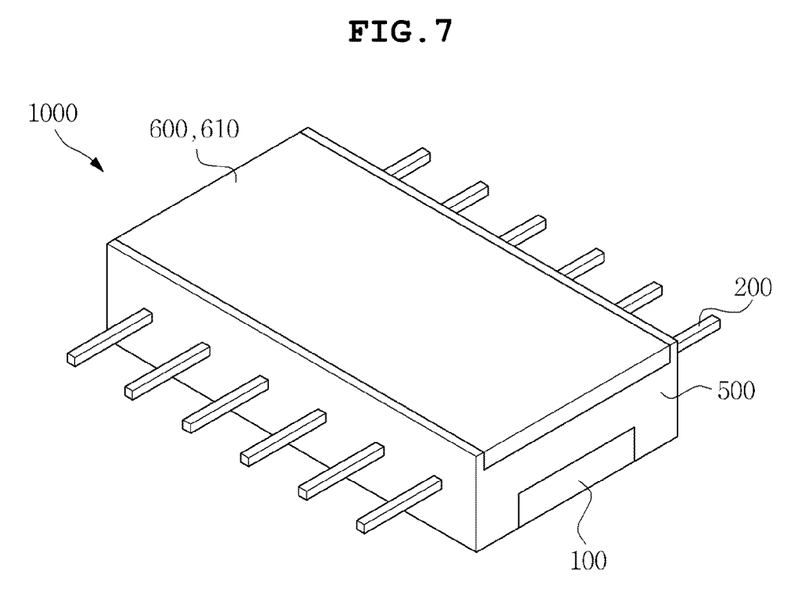
FIG. 7 is a perspective view schematically illustrating a power module package according to a third preferred embodiment of the present invention.
Figure 8:
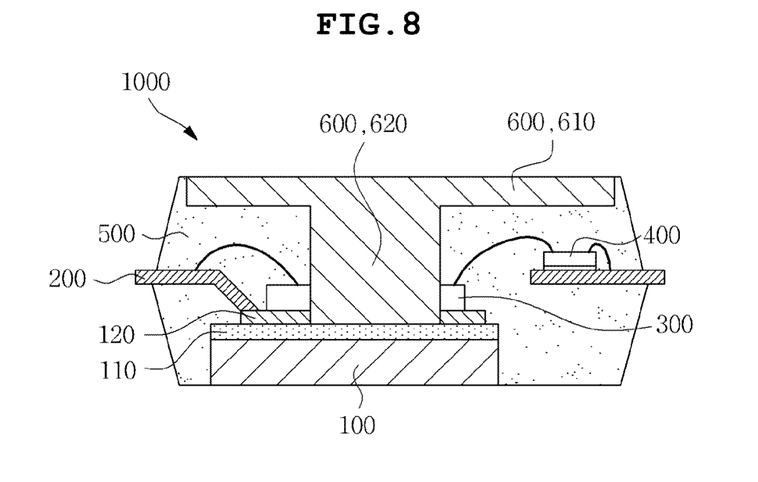
FIG. 8 is a right cross-sectional view schematically illustrating the power module package according to the third preferred embodiment of the present invention.
Figure 9:
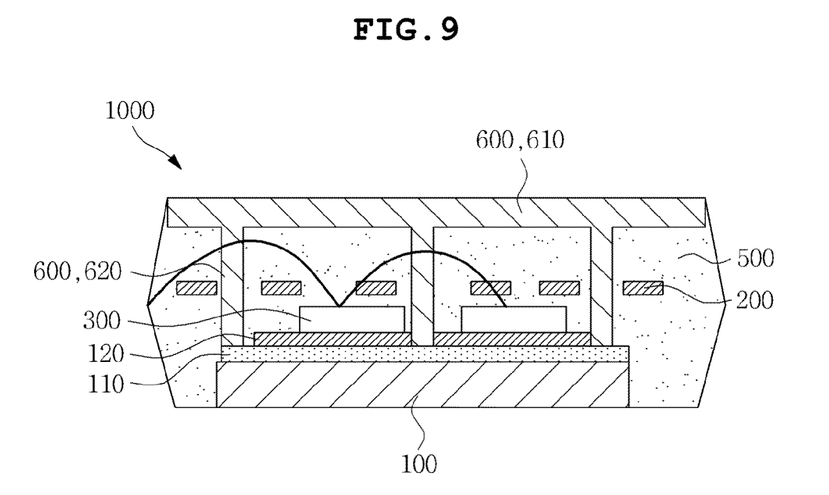
FIG. 9 is a left cross-sectional view schematically illustrating the power module package according to the third preferred embodiment of the present invention.

Further, it is possible to constantly maintain the interval between another heat sink (not illustrated) and the electrolytic cap (not illustrated) which are bonded to the package board without the stopper, by controlling the height of the heat sink Third Preferred Embodiment FIGS. 7 to 9 are diagrams schematically illustrating a structure of a power module package 1000 according to a third preferred embodiment of the present invention.

Referring to FIGS. 7 to 9, the power module package 1000 includes a metal substrate 100 which has an insulating layer 110 and a circuit pattern 120 formed on one surface thereof, at least one first electronic device 300 which is mounted on the circuit pattern 120, a lead frame 200 which is disposed around the metal substrate 100, a molding area 500 enclosing the metal substrate 100, the first electronic device 300, and a portion of the lead frame 200, and a heat sink 600 which includes a connection part 620 contacting the insulating layer 110 and a body part 610 disposed on a surface opposite to the first electronic device 300 and including one surface bonded to the connection part 620 and the other surface exposed from an upper surface of the molding area 500.

In this case, the metal substrate 100 may be made of any one selected from aluminum (Al), aluminum alloy (Al alloy), copper (Cu), iron (Fe), iron-nickel alloy (Fe—Ni alloy), and titanium (Ti) which are conductive metal materials, but is not particularly limited thereto.

According to the preferred embodiment of the present invention, a circuit pattern 120 may be formed on the metal substrate 100 including the insulating layer 110 or the circuit pattern 120 may be formed on the metal substrate 100 including an anodized layer.

The anodized layer is generated by immersing the metal substrate 100 made of aluminum or aluminum alloy in an electrolyte solution such as boric acid, phosphoric acid, sulfuric acid, chromic acid, or the like, applying an anode to the metal substrate, and applying a cathode to the electrolyte solution and has an insulating property and relatively high heat transfer characteristics of about 10 to 30 W/mk.

As described above, the anodized layer made of aluminum or aluminum alloy may be an aluminum anodized layer ($Al_2O_3$).

The anodized layer has insulation property, and therefore a circuit layer may be formed on the substrate. In addition, the anodized layer may have a thickness thinner than that of a general insulation layer 110, and therefore may improve the heat radiation performance as well as may be formed in a thin type.

The circuit pattern 120 is formed on the insulating layer 110 or the anodized layer and a circuit may be formed by a pattern forming method already known in the art. In this case, any material which is used as a conductive metal may be used without limitation but copper is typically used.

The preferred embodiment of the present invention describes the metal substrate 100 configured of the insulating layer 110, the anodized layer, and the circuit pattern 120, by way of example, but is not particularly limited thereto. For example, a printed circuit board (PCB), a substrate made of ceramic, and the like may be used.

The first electronic devices 300 are mounted on the circuit pattern 120 which is formed on the metal substrate 100, in which at least one first electronic device 300 is bonded thereto and may be a power device.

For example, the power device may include a silicon controlled rectifier (SCR), a power transistor, an insulated gate bipolar transistor (IGBT), a metal oxide semiconductor (MOS) transistor, a power rectifier, a power regulator, an inverter, a converter, or a device having a large heat value, such as a high power semiconductor chip or diode including a combination thereof.

In these drawings, other components of the electronic device are omitted and schematically illustrated, but it may be sufficiently recognized by those skilled in the art that the electronic device having all the structures known in the art may be applied to the power module package 1000 according to the preferred embodiment of the present invention without being particularly limited.

In this case, the first electronic device 300 may be formed on the circuit pattern 120 by soldering or conductive epoxy or ultrasonic bonding process, but is not particularly limited thereto.

The soldering may be made by using, for example, a Sn—Pb eutectic solder or a lead free solder such as Sn—Ag—Cu. Further, the soldering method may be formed of a solder paste applying process using a metal mask. However, the soldering method is not limited thereto.

As a connection terminal for electrically connecting between an inside and an outside of the power module package 1000, at least one lead frame 200 may be disposed around the metal substrate 100.

The lead frame 200 may be made of any one selected from copper (Cu), iron (Fe), and iron-nickel alloy (Fe—Ni alloy), but is not particularly limited thereto.

When the lead frame 200 is disposed around the metal substrate 100, the lead frame 200 may be connected to the metal substrate 100, the first electronic device 300, and a second electronic device 400 to be described below by a conductive connection part 620.

Further, a shape of the lead frame 200 may be variously changed, and thus is changed as the designer desired shape and may directly contact the circuit pattern 120 and thus is electrically connected thereto.

In the present drawings, the lead frame 200 is not formed with a step part, but may be additionally formed with at least one step part.

In this case, the connection part 620 may be a wire, and at least two of the metal substrate 100, the lead frame 200, the first electronic device 300, and the second electronic device 400 are selected and may be electrically connected to each other by various methods in addition to a wire bonding.

Here, the wire bonding process may be performed by ball bonding, wedge bonding, and stitch bonding well known in the art, but is not particularly limited thereto.

Here, the wire is made of aluminum (Al), gold (Au), copper (Cu), and the like, but the preferred embodiment of the present invention is not particularly thereto. Generally, the wire applying a high rated voltage to the electronic device which is the power device is made of aluminum (Al). Meanwhile, a thick wire needs to be used to withstand a high voltage. Therefore, it is more effective to use aluminum (Al) in terms of the reduction in costs than using gold (Au) or copper (Cu).

The connection part 620 is not particularly limited, but instead of the wire, the lead frame, a metal ribbon, or the like may also be used.

At least one second electronic device 400 may be mounted on the lead frame 200.

The second electronic device 400 may be a control device and is a device having a small heat value like a control integrated circuit (IC).

As described above, the power module package 1000 further includes the molding area enclosing the metal substrate 100, the first electronic device 300, the second electronic device 400, and the lead frame 200. In this case, one surface of the metal substrate 100 and a portion of the lead frame 200 may be exposed to the outside.

In this case, since the molding area 500 is formed to be filled in the upper portion of the metal substrate 100, an adhesion between a molding material and the metal substrate 100 is increased, such that an occurrence of a problem such as delamination between the metal substrate 100 and the molding area 500 is reduced, thereby improving the long-term reliability of the substrate.

Further, heat shielding due to the molding is made, and therefore the heat radiation effect may be more improved by enclosing the electronic device having a large heat value like the power device.

The molding area 500 is filled between the first electronic device 300 mounted on the metal substrate 100 and the second electronic device 400 mounted on the lead frame 200 to prevent an electrical short from occurring between the electronic devices. Further, the molding area encloses and fixes outside the electronic device to safely protect the electronic device from an external impact.

In this case, the molding area 500 may be made of a thermoplastic resin, such as silicon gel and polyimide, a thermosetting resin, such as epoxy resin, and the like, and the molding area 500 may generally be made of an epoxy molded compound (EMC), but is not particularly limited thereto.

In this case, a portion of the molding area 500 is formed with cavities into which the connection parts 620 of the heat sink 600 to be described below are inserted and a position of the cavity is the same as a position into which the connection part 620 of the heat sink 600 is inserted.

The heat sink 600 includes a plate-shaped body part 610 which is located at a surface opposite to the first electronic device 300 and a plurality of connection parts 620 formed on one surface of the body part 610.

Here, the plurality of connection parts 620 are inserted into the cavities of the molding area 500 as described above and is bonded to the insulating layer 110 of the metal substrate 100.

When the connection part 620 of the heat sink 600 is bonded to the circuit pattern 120 which is formed on the metal substrate 100 or the insulating layer 110, sparking occurs and thus the insulating material therearound is broken and other various defects may occur but the connection part 620 of the heat sink 600 is bonded to the insulating layer 110, thereby stably bonded the metal substrate 100 with the heat sink 600.

The body part 610 has a plate shape and includes one surface connected to the plurality of connection parts 620 and the other surface exposed from the upper surface of the molding area 500 as described above.

The body part 610 of the heat sink 600 has a size covering the whole of the upper surface of the molding area 500 and a height of the other surface of the body part 610 may be formed to be equal to or less than the upper surface of the molding area 500.

As such, the heat radiation performance may be controlled as the designer needs by controlling the size and height of the heat sink 600 and the heat sink 600 is easily detached by a physical force.

The heat sink 600 is made of a material, such as copper Cu or tin (Sn) having excellent heat conductivity without being particularly limited and may be generally configured by being coated with the materials.

Although not illustrated in the drawings of the preferred embodiment of the present invention, the power module package 1000 may further include another heat sink (not illustrated) which is bonded to the other surface of the metal substrate 100 exposed by the molding area 500.

The heat sink (not illustrated) may include a plurality of heat radiating pin to diffuse heat generated from the first electronic device 300 to the air.

Further, the heat sink (not illustrated) is not particularly limited, but is generally made of the material of copper (Cu) or tin (Sn) like the heat sink (not illustrated) as described above and is generally configured by being coated with the material, such that the heat sink has the excellent heat transfer characteristics and is easily bonded to the substrate.

The power module package 1000 according to the preferred embodiment of the present invention has a structure in which the heat sinks 600 are formed on both surfaces of the metal substrate 100, thereby obtaining the excellent heat radiation effect.

Figure 10:
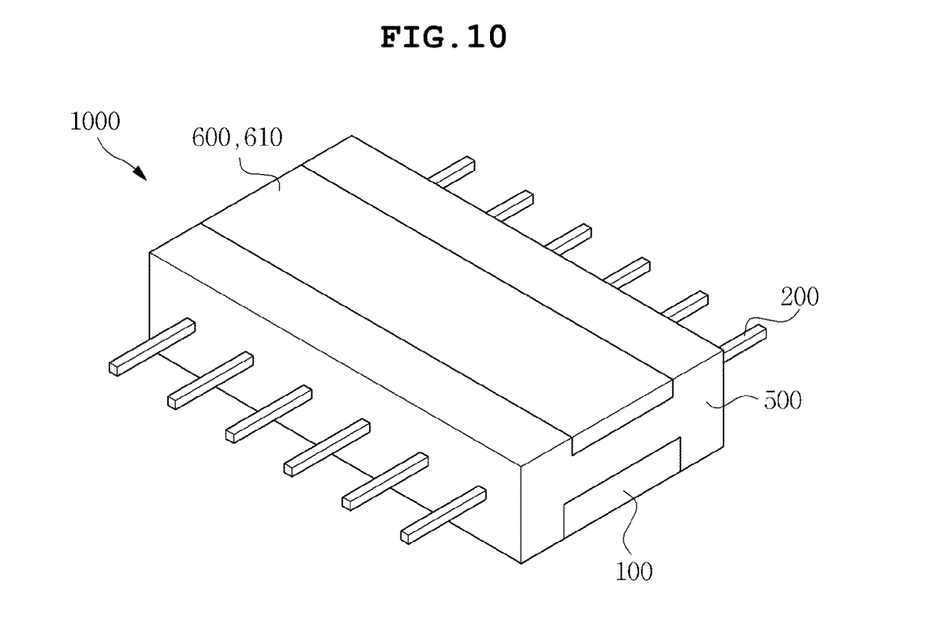
FIG. 10 is a perspective view schematically illustrating a power module package according to a fourth preferred embodiment of the present invention.
Figure 11:
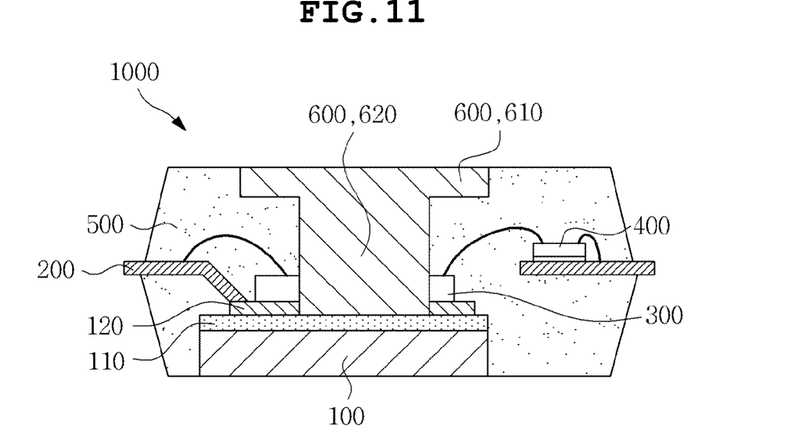
FIG. 11 is a right cross-sectional view schematically illustrating the power module package according to the fourth preferred embodiment of the present invention.
Figure 12:
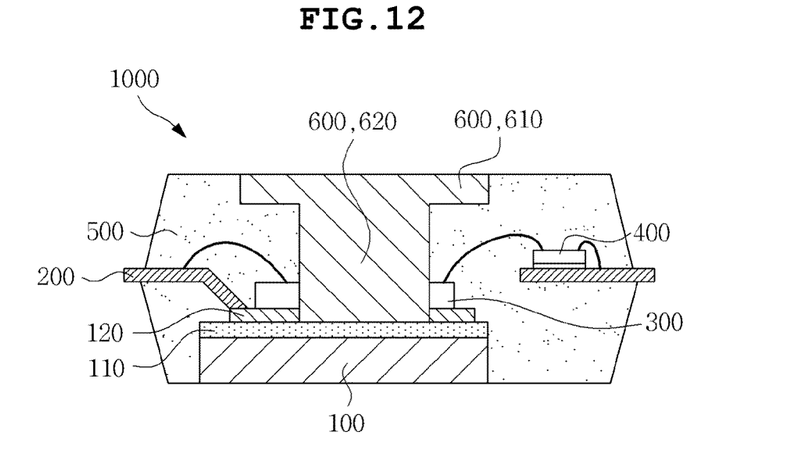
FIG. 12 is a left cross-sectional view schematically illustrating the power module package according to the fourth preferred embodiment of the present invention.

Further, it is possible to constantly maintain the interval between another heat sink (not illustrated) and the electrolytic cap (not illustrated) which are bonded to the package board without the stopper, by controlling the height of the heat sink Fourth Preferred Embodiment FIGS. 10 to 12 are diagrams schematically illustrating a structure of a power module package 1000 according to a fourth preferred embodiment of the present invention.

Referring to FIGS. 10 to 12, the power module package 1000 includes a metal substrate 100 which has an insulating layer 110 and a circuit pattern 120 formed on one surface thereof, at least one first electronic device 300 which is mounted on the circuit pattern 120, a lead frame 200 which is disposed around the metal substrate 100, a molding area 500 enclosing the metal substrate 100, the first electronic device 300, and a portion of the lead frame 200, and a heat sink 600 which includes a connection part 620 contacting the insulating layer 110 and a body part 610 disposed on a surface opposite to the first electronic device 300 and including one surface bonded to the connection part 620 and the other surface exposed from an upper surface of the molding area 500.

In this case, the metal substrate 100 may be made of any one selected from aluminum (Al), aluminum alloy (Al alloy), copper (Cu), iron (Fe), iron-nickel alloy (Fe—Ni alloy), and titanium (Ti) which are conductive metal materials, but is not particularly limited thereto.

According to the preferred embodiment of the present invention, a circuit pattern 120 may be formed on the metal substrate 100 including the insulating layer 110 or the circuit pattern 120 may be formed on the metal substrate 100 including an anodized layer.

The anodized layer is generated by immersing the metal substrate 100 made of aluminum or aluminum alloy in an electrolyte solution such as boric acid, phosphoric acid, sulfuric acid, chromic acid, or the like, applying an anode to the metal substrate, and applying a cathode to the electrolyte solution and has an insulating property and relatively high heat transfer characteristics of about 10 to 30 W/mk.

As described above, the anodized layer made of aluminum or aluminum alloy may be an aluminum anodized layer ($Al_2O_3$).

The anodized layer has insulation property, and therefore a circuit layer may be formed on the substrate. In addition, the anodized layer may have a thickness thinner than that of a general insulation layer 110, and therefore may improve the heat radiation performance as well as may be formed in a thin type.

The circuit pattern 120 is formed on the insulating layer 110 or the anodized layer and a circuit may be formed by a pattern forming method already known in the art. In this case, any material which is used as a conductive metal may be used without limitation but copper is typically used.

The preferred embodiment of the present invention describes the metal substrate 100 configured of the insulating layer 110, the anodized layer, and the circuit pattern 120, by way of example, but is not particularly limited thereto. For example, a printed circuit board (PCB), a substrate made of ceramic, and the like may be used.

The first electronic devices 300 are mounted on the circuit pattern 120 which is formed on the metal substrate 100, in which at least one first electronic device 300 is bonded thereto and may be a power device.

For example, the power device may include a silicon controlled rectifier (SCR), a power transistor, an insulated gate bipolar transistor (IGBT), a metal oxide semiconductor (MOS) transistor, a power rectifier, a power regulator, an inverter, a converter, or a device having a large heat value, such as a high power semiconductor chip or diode including a combination thereof.

In these drawings, other components of the electronic device are omitted and schematically illustrated, but it may be sufficiently recognized by those skilled in the art that the electronic device having all the structures known in the art may be applied to the power module package 1000 according to the preferred embodiment of the present invention without being particularly limited.

In this case, the first electronic device 300 may be formed on the circuit pattern 120 by soldering or conductive epoxy or ultrasonic bonding process, but is not particularly limited thereto.

The soldering may be made by using, for example, a Sn—Pb eutectic solder or a lead free solder such as Sn—Ag—Cu. Further, the soldering method may be formed of a solder paste applying process using a metal mask. However, the soldering method is not limited thereto.

As a connection terminal for electrically connecting between an inside and an outside of the power module package 1000, at least one lead frame 200 may be disposed around the metal substrate 100.

The lead frame 200 may be made of any one selected from copper (Cu), iron (Fe), and iron-nickel alloy (Fe—Ni alloy), but is not particularly limited thereto.

When the lead frame 200 is disposed around the metal substrate 100, the lead frame 200 may be connected to the metal substrate 100, the first electronic device 300, and a second electronic device 400 to be described below by a conductive connection part 620.

Further, a shape of the lead frame 200 may be variously changed, and thus is changed as the designer desired shape and may directly contact the circuit pattern 120 and thus is electrically connected thereto.

In the present drawings, the lead frame 200 is not formed with a step part, but may be additionally formed with at least one step part.

In this case, the connection part 620 may be a wire, and at least two of the metal substrate 100, the lead frame 200, the first electronic device 300, and the second electronic device 400 are selected and may be electrically connected to each other by various methods in addition to a wire bonding.

Here, the wire bonding process may be performed by ball bonding, wedge bonding, and stitch bonding well known in the art, but is not particularly limited thereto.

Here, the wire is made of aluminum (Al), gold (Au), copper (Cu), and the like, but the preferred embodiment of the present invention is not particularly thereto. Generally, the wire applying a high rated voltage to the electronic device which is the power device is made of aluminum (Al). Meanwhile, a thick wire needs to be used to withstand a high voltage. Therefore, it is more effective to use aluminum (Al) in terms of the reduction in costs than using gold (Au) or copper (Cu).

The connection part 620 is not particularly limited, but instead of the wire, the lead frame, a metal ribbon, or the like may also be used.

At least one second electronic device 400 may be mounted on the lead frame 200.

The second electronic device 400 may be a control device and is a device having a small heat value like a control integrated circuit (IC).

As described above, the power module package 1000 further includes the molding area enclosing the metal substrate 100, the first electronic device 300, the second electronic device 400, and the lead frame 200. In this case, one surface of the metal substrate 100 and a portion of the lead frame 200 may be exposed to the outside.

In this case, since the molding area 500 is formed to be filled in the upper portion of the metal substrate 100, an adhesion between a molding material and the metal substrate 100 is increased, such that an occurrence of a problem such as delamination between the metal substrate 100 and the molding area 500 is reduced, thereby improving the long-term reliability of the substrate.

Further, heat shielding due to the molding is made, and therefore the heat radiation effect may be more improved by enclosing the electronic device having a large heat value like the power device.

The molding area 500 is filled between the first electronic device 300 mounted on the metal substrate 100 and the second electronic device 400 mounted on the lead frame 200 to prevent an electrical short from occurring between the electronic devices. Further, the molding area encloses and fixes outside the electronic device to safely protect the electronic device from an external impact.

In this case, the molding area 500 may be made of a thermoplastic resin, such as silicon gel and polyimide, a thermosetting resin, such as epoxy resin, and the like, and the molding area 500 may generally be made of an epoxy molded compound (EMC), but is not particularly limited thereto.

In this case, a portion of the molding area 500 is formed with cavities into which the connection parts 620 of the heat sink 600 to be described below are inserted and a position of the cavity is the same as a position into which the connection part 620 of the heat sink 600 is inserted.

The heat sink 600 includes a plate-shaped body part 610 which is located at a surface opposite to the first electronic device 300 and a plurality of connection parts 620 formed on one surface of the body part 610.

Here, the plurality of connection parts 620 are inserted into the cavities of the molding area 500 as described above and is bonded to the insulating layer 110 of the metal substrate 100.

When the connection part 620 of the heat sink 600 is bonded to the circuit pattern 120 which is formed on the metal substrate 100 or the insulating layer 110, sparking occurs and thus the insulating material therearound is broken and other various defects may occur but the connection part 620 of the heat sink 600 is bonded to the insulating layer 110, thereby stably bonded the metal substrate 100 with the heat sink 600.

The body part 610 has a plate shape and includes one surface connected to the plurality of connection parts 620 and the other surface exposed from the upper surface of the molding area 500 as described above.

The body part 610 of the heat sink 600 has a size covering a portion of the upper surface of the molding area 500 and a height of the other surface of the body part 610 may be formed to be lower than or equal to the upper surface of the molding area 500.

As such, the heat radiation performance may be controlled as the designer needs by controlling the size and height of the heat sink 600 and the heat sink 600 is easily detached by a physical force.

The heat sink 600 is made of a material, such as copper Cu or tin (Sn) having excellent heat conductivity without being particularly limited and may be generally configured by being coated with the materials.

Although not illustrated in the drawings of the preferred embodiment of the present invention, the power module package 1000 may further include another heat sink (not illustrated) which is bonded to the other surface of the metal substrate 100 exposed by the molding area 500.

The heat sink (not illustrated) may include a plurality of heat radiating pin to diffuse heat generated from the first electronic device 300 to the air.

Further, the heat sink (not illustrated) is not particularly limited, but is generally made of the material of copper (Cu) or tin (Sn) like the heat sink (not illustrated) as described above and is generally configured by being coated with the material, such that the heat sink has the excellent heat transfer characteristics and is easily bonded to the substrate.

The power module package 1000 according to the preferred embodiment of the present invention has a structure in which the heat sinks 600 are formed on both surfaces of the metal substrate 100, thereby obtaining the excellent heat radiation effect.

Further, it is possible to constantly maintain the interval between another heat sink (not illustrated) and the electrolytic cap (not illustrated) which are bonded to the package board without the stopper, by controlling the height of the heat sink.

Method for Manufacturing Power Module Package

FIGS. 13 to 18 are process cross-sectional views sequentially illustrating a method for manufacturing a power module package 1000 according to a preferred embodiment of the present invention.

Figure 13:
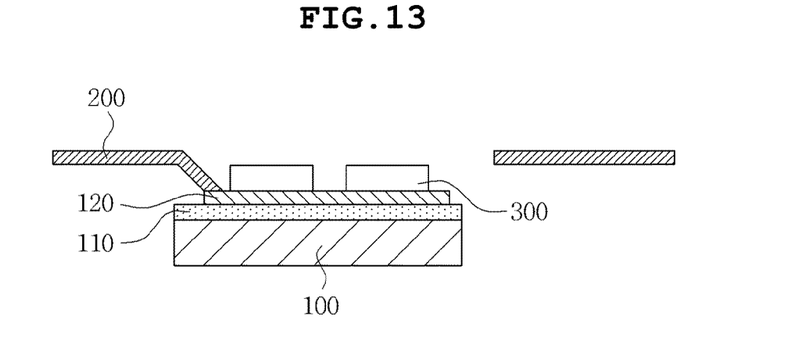
FIGS. 13 to 18 are process cross-sectional views sequentially illustrating a method for manufacturing a power module package according to a preferred embodiment of the present invention.
Figure 14:
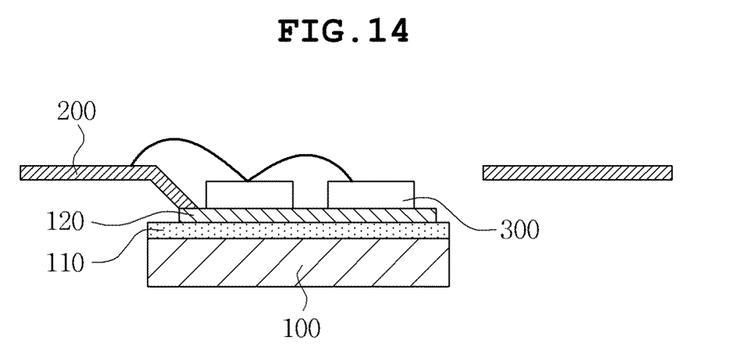

First, referring to FIGS. 13 and 14, the metal substrate 100 having one surface formed with the circuit pattern 120 on which the first electronic device 300 is mounted and the insulating layer 110 is prepared and the lead frame 200 disposed around the metal substrate 100 is prepared.

First, the metal substrate 100 is prepared.

The metal substrate 100 may be made of any one selected from aluminum (Al), aluminum alloy (Al alloy), copper (Cu), iron (Fe), iron-nickel alloy (Fe—Ni alloy), and titanium (Ti) which are conductive metal materials, but is not particularly limited thereto.

According to the preferred embodiment of the present invention, a circuit pattern 120 may be formed on the metal substrate 100 including the insulating layer 110 or the circuit pattern 120 may be formed on the metal substrate 100 including an anodized layer.

The anodized layer is generated by immersing the metal substrate 100 made of aluminum or aluminum alloy in an electrolyte solution such as boric acid, phosphoric acid, sulfuric acid, chromic acid, or the like, applying an anode to the metal substrate, and applying a cathode to the electrolyte solution and has an insulating property and relatively high heat transfer characteristics of about 10 to 30 W/mk.

As described above, the anodized layer made of aluminum or aluminum alloy may be an aluminum anodized layer ($Al_2O_3$).

The anodized layer has insulation property, and therefore a circuit layer may be formed on the substrate. In addition, the anodized layer may have a thickness thinner than that of a general insulation layer 110, and therefore may improve the heat radiation performance as well as may be formed in a thin type.

The circuit pattern 120 is formed on the insulating layer 110 or the anodized layer and a circuit may be formed by a pattern forming method already known in the art. In this case, any material which is used as a conductive metal may be used without limitation but copper is typically used.

The preferred embodiment of the present invention describes the metal substrate 100 configured of the insulating layer 110, the anodized layer, and the circuit pattern 120, by way of example, but is not particularly limited thereto. For example, a printed circuit board (PCB), a substrate made of ceramic, and the like may be used.

Next, the first electronic device 300 is mounted on the circuit pattern 120 which is formed on the metal substrate 100.

At least one first electronic device 300 is bonded and may be the power device.

For example, the power device may include a silicon controlled rectifier (SCR), a power transistor, an insulated gate bipolar transistor (IGBT), a metal oxide semiconductor (MOS) transistor, a power rectifier, a power regulator, an inverter, a converter, or a device having a large heat value, such as a high power semiconductor chip or diode including a combination thereof.

In these drawings, other components of the electronic device are omitted and schematically illustrated, but it may be sufficiently recognized by those skilled in the art that the electronic device having all the structures known in the art may be applied to the power module package 1000 according to the preferred embodiment of the present invention without being particularly limited.

In this case, the first electronic device 300 may be mounted on the circuit pattern 120 by soldering or conductive epoxy or ultrasonic bonding process, but is not particularly limited thereto.

The soldering may be made by using, for example, a Sn—Pb eutectic solder or a lead free solder such as Sn—Ag—Cu. Further, the soldering method may be formed of a solder paste applying process using a metal mask. However, the soldering method is not limited thereto.

Next, as the connection terminal for electrically connecting between the inside and the outside of the power module package 1000, at least one lead frame 200 is disposed around the metal substrate 100.

The lead frame 200 may be made of any one selected from copper (Cu), iron (Fe), and iron-nickel alloy (Fe—Ni alloy), but is not particularly limited thereto.

Next, the lead frame 200 connects at least one first electronic device 300 mounted on the metal substrate 100 and electrically connects the first electronic device 300 with the lead frame 200.

In this case, the connection part 620 may be a wire, and at least two of the metal substrate 100, the lead frame 200, the first electronic device 300, and the second electronic device 400 are selected and may be electrically connected to each other by various methods in addition to a wire bonding.

Here, the wire bonding process may be performed by ball bonding, wedge bonding, and stitch bonding well known in the art, but is not particularly limited thereto.

Here, the wire is made of aluminum (Al), gold (Au), copper (Cu), and the like, but the preferred embodiment of the present invention is not particularly thereto. Generally, the wire applying a high rated voltage to the electronic device which is the power device is made of aluminum (Al). Meanwhile, a thick wire needs to be used to withstand a high voltage. Therefore, it is more effective to use aluminum (Al) in terms of the reduction in costs than using gold (Au) or copper (Cu).

The connection part 620 is not particularly limited, but instead of the wire, the lead frame, a metal ribbon, or the like may also be used.

Figure 15:
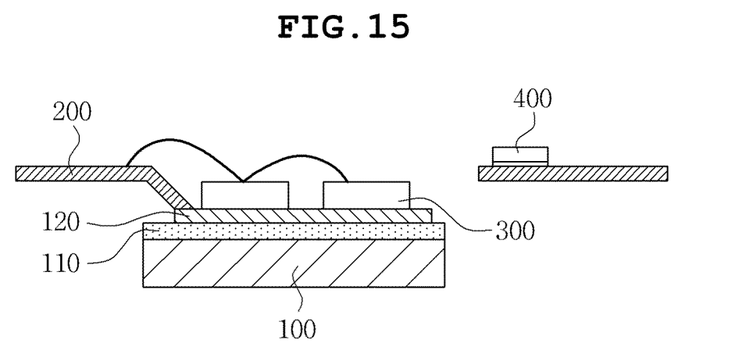
Figure 16:
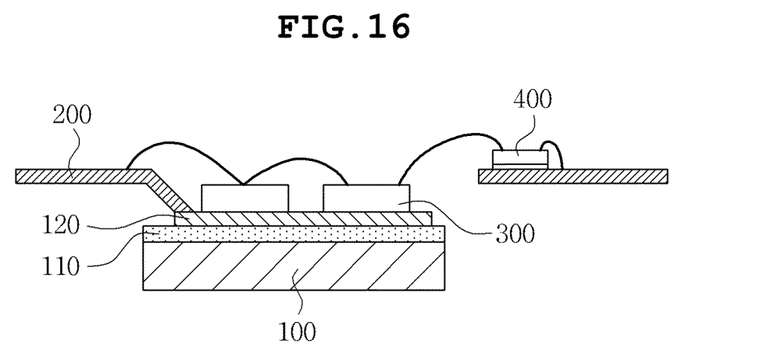

Next, referring to FIGS. 15 and 16, at least one second electronic device 400 is mounted on the lead frame 200.

The second electronic device 400 may be a control device and is a device having a small heat value like a control integrated circuit (IC).

As such, the second electronic device 400 mounted on the lead frame 200 is electrically connected with the first electronic device 300.

In this case, the connection part 620 may be a wire, and at least two of the metal substrate 100, the lead frame 200, the first electronic device 300, and the second electronic device 400 are selected and may be electrically connected to each other by various methods in addition to a wire bonding.

Here, the wire bonding process may be performed by ball bonding, wedge bonding, and stitch bonding well known in the art, but is not particularly limited thereto.

Here, the wire is made of aluminum (Al), gold (Au), copper (Cu), and the like, but the preferred embodiment of the present invention is not particularly thereto. Generally, the wire applying a high rated voltage to the electronic device which is the power device is made of aluminum (Al). Meanwhile, a thick wire needs to be used to withstand a high voltage. Therefore, it is more effective to use aluminum (Al) in terms of the reduction in costs than using gold (Au) or copper (Cu).

The connection part 620 is not particularly limited, but instead of the wire, the lead frame, a metal ribbon, or the like may also be used.

Figure 17:
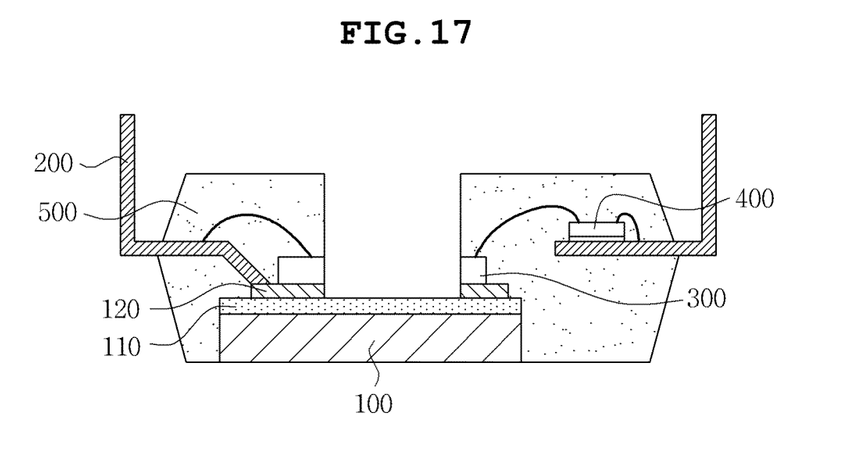

Next, referring to FIG. 17, the molding area 500 which encloses the metal substrate 100, the first electronic device 300, the second electronic device 400, and the lead frame is formed. One surface of the metal substrate 100 and a portion of the lead frame 200 may be formed to be exposed to the outside.

In this case, since the molding area 500 is formed to be filled the upper portion of the metal substrate 100 with resin by the molding apparatus, the adhesion between the molding material and the metal substrate 100 is increased, such that an occurrence of a problem such as delamination between the metal substrate 100 and the molding area 500 is reduced, thereby improving the long-term reliability of the substrate.

Further, heat shielding due to the molding is made, and therefore the heat radiation effect may be more improved by enclosing the electronic device having a large heat value like the power device.

The molding area 500 is filled between the first electronic device 300 mounted on the metal substrate 100 and the second electronic device 400 mounted on the lead frame 200 to prevent an electrical short from occurring between the electronic devices. Further, the molding area encloses and fixes outside the electronic device to safely protect the electronic device from an external impact.

In this case, the molding area 500 may be made of a thermoplastic resin, such as silicon gel and polyimide, a thermosetting resin, such as epoxy resin, and the like, and the molding area 500 may generally be made of an epoxy molded compound (EMC), but is not particularly limited thereto.

Next, at least one cavity is formed in the molding area 500.

The cavity may be formed by the laser machining, and the cavity forming part is prepared after the present step and is formed at the same position as a position at which the connection part 620 of the heat sink 600 is inserted into the cavity.

The laser machining for forming the cavity mainly uses a CO2 laser, but the laser machining may be performed by at least one of carbon dioxide (CO2), YAG, and eximer, but in the present invention, kinds of laser are not limited.

Further, the shape of the lead frame 200 may be changed to the designer desired shape.

At least one step part may be additionally formed by cutting or bending the lead frame 200.

As the machining method for changing the shape of the lead frame 200, various methods such as chemical and physical methods are used and a method for bending the lead frame 200 by a physical force is generally used, but the preferred embodiment of the present invention is not particularly limited thereto.

Figure 18:
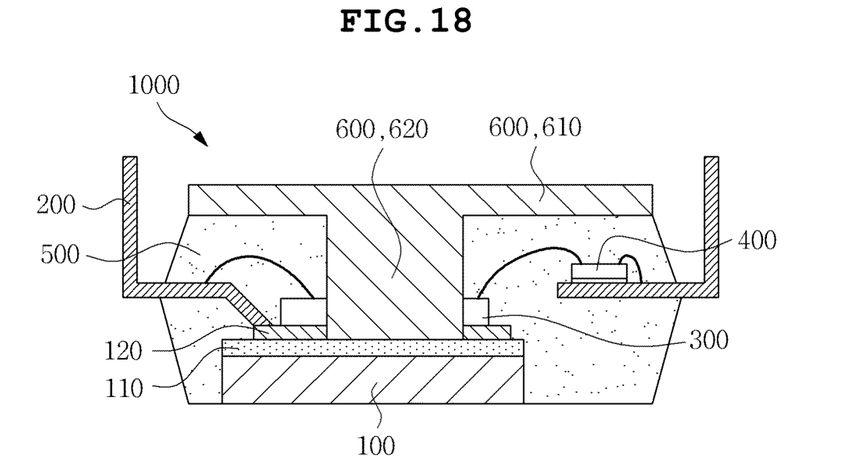

Next, referring to FIG. 18, the heat sink 600 to be inserted into the cavity of the molding area 500 is prepared and fastened.

The heat sink 600 includes a plate-shaped body part 610 which is located at a surface opposite to the first electronic device 300 and a plurality of connection parts 620 formed on one surface of the body part 610.

Here, the plurality of connection parts 620 are inserted into the cavities of the molding area 500 as described above and is bonded to the insulating layer 110 of the metal substrate 100.

When the connection part 620 of the heat sink 600 is bonded to the circuit pattern 120 which is formed on the metal substrate 100 or the insulating layer 110, sparking occurs and thus the insulating material therearound is broken and other various defects may occur but the connection part 620 of the heat sink 600 is bonded to the insulating layer 110, thereby stably bonded the metal substrate 100 with the heat sink 600.

The body part 610 has a plate shape and includes one surface connected to the plurality of connection parts 620 and the other surface exposed from the upper surface of the molding area 500 as described above.

The body part 610 of the heat sink 600 has a size covering the whole or a portion of the upper surface of the molding area 500 and a height of the other surface of the body part 610 may be formed to be higher than or lower than or equal to the upper surface of the molding area 500.

As such, the heat radiation performance may be controlled as the designer needs by controlling the size and height of the heat sink 600 and the heat sink 600 is easily detached by a physical force.

The heat sink 600 is made of a material, such as copper Cu or tin (Sn) having excellent heat conductivity without being particularly limited and may be generally configured by being coated with the materials.

The method for manufacturing a power module package 1000 according to the preferred embodiment of the present invention has the structure in which the heat sinks 600 are formed on both surfaces of the metal substrate 100, thereby obtaining the excellent heat radiation effect.

Further, it is possible to constantly maintain the interval between another heat sink (not illustrated) and the electrolytic cap (not illustrated) which are bonded to the package board without the stopper, by controlling the height of the heat sink.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A power module package, comprising:
   a metal substrate having an insulating layer and a circuit pattern formed on one surface thereof;
   at least one first electronic device mounted on the circuit pattern;
   a lead frame disposed around the metal substrate;
   a molding area enclosing the metal substrate, the first electronic device, and a portion of the lead frame; and
   a heat sink including a connection part contacting the insulating layer and a body part disposed on a surface opposite to the first electronic device and including one surface bonded to the connection part and the other surface exposed from an upper surface of the molding area.

2. The power module package as set forth in claim 1, wherein the first electronic device is a power device.

3. The power module package as set forth in claim 1, further comprising:
   a second electronic device mounted on the lead frame.

4. The power module package as set forth in claim 3, wherein the second electronic device is a control device.

5. The power module package as set forth in claim 1, wherein the heat sink is made of a conductive metal material.

6. The power module package as set forth in claim 1, wherein the body part of the heat sink covers the whole of the upper surface of the molding area.

7. The power module package as set forth in claim 1, wherein the body part of the heat sink covers a portion of the upper surface of the molding area.

8. The power module package as set forth in claim 1, wherein a height of the other surface of the body part of the heat sink is formed to be higher than or equal to the upper surface of the molding part.

9. The power module package as set forth in claim 1, wherein a height of the other surface of the body part of the heat sink is formed to be lower than or equal to the upper surface of the molding part.

10. A method for manufacturing a power module package, comprising:
    preparing a lead frame disposed around a metal substrate having one surface formed with a circuit pattern on which a first electronic device is mounted and an insulating layer;
    forming a molding area enclosing the metal substrate, the first electronic device, and a portion of the lead frame; and
    preparing a heat sink including a connection part contacting the insulating layer and a body part bonded to the connection part and having one surface disposed on a surface opposite to the first electronic device and the other surface exposed from an upper surface of the molding area and fastening the heat sink to contact the insulating layer.

11. The method as set forth in claim 10, wherein the first electronic device is a power device.

12. The method as set forth in claim 10, further comprising:
    prior to the forming of the molding part, electrically connecting the first electronic device with the lead frame.

13. The method as set forth in claim 10, wherein the heat sink is made of a conductive metal material.

14. The method as set forth in claim 10, wherein the body part of the heat sink has a size covering the whole of the upper surface of the molding area.

15. The method as set forth in claim 10, wherein the body part of the heat sink has a size covering a portion of the upper surface of the molding area.

16. The method as set forth in claim 10, wherein the other surface of the body part of the heat sink is formed to be equal to or higher than the upper surface of the molding part.

17. The method as set forth in claim 10, wherein the other surface of the body part of the heat sink is formed to be equal to or lower than the upper surface of the molding part.

18. The method as set forth in claim 10, further comprising:
    prior to the forming of the molding part, standing and fixing a support pin on the insulating layer at a position corresponding to a position into which the connection part of the heat sink is inserted; and
    after the forming of the molding part, forming a through hole exposing an insulating layer from the upper surface of the molding part by removing the support pin.

19. The method as set forth in claim 10, further comprising:
    after the forming of the molding part, hardening a molding area by a thermosetting process.

* * * * *